United States Patent
Narasimhan et al.

(10) Patent No.: US 10,140,224 B2
(45) Date of Patent: Nov. 27, 2018

(54) NOISE IMMUNE DATA PATH SCHEME FOR MULTI-BANK MEMORY ARCHITECTURE

(71) Applicant: QUALCOMM Incorporated, San Diego, CA (US)

(72) Inventors: Mukund Narasimhan, Bangalore (IN); Sharad Kumar Gupta, Bangalore (IN); Dharaneedharan Shanmugasundaram, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/461,184

(22) Filed: Mar. 16, 2017

(65) Prior Publication Data

US 2018/0113821 A1 Apr. 26, 2018

Related U.S. Application Data

(60) Provisional application No. 62/410,704, filed on Oct. 20, 2016.

(51) Int. Cl.
*G11C 11/00* (2006.01)
*G06F 13/16* (2006.01)
(Continued)

(52) U.S. Cl.
CPC ............ *G06F 13/1689* (2013.01); *G11C 7/02* (2013.01); *G11C 7/1087* (2013.01); *G11C 7/12* (2013.01);
(Continued)

(58) Field of Classification Search
CPC ... G11C 16/26; G11C 11/1673; G11C 13/004; G11C 11/5642; G11C 11/4091; G11C 11/34; G11C 7/1087
See application file for complete search history.

(56) References Cited

U.S. PATENT DOCUMENTS 5,317,537 A * 5/1994 Shinagawa .............. G11C 8/16
365/189.04
7,106,620 B2 9/2006 Chang et al.
(Continued)

FOREIGN PATENT DOCUMENTS

EP 1241676 A1 9/2002

OTHER PUBLICATIONS

International Search Report and Written Opinion—PCT/US2017/053284—ISA/EPO—dated Jan. 29, 2018.
(Continued)

*Primary Examiner* — Uyen B Tran
(74) *Attorney, Agent, or Firm* — Arent Fox, LLP and Qualcomm Incorporated

(57) ABSTRACT

In an aspect of the disclosure, an apparatus is provided. In one aspect, the apparatus is a memory apparatus. The memory apparatus includes a memory. The memory includes first and second bitcell arrays. The memory apparatus also includes a sense amplifier. The sense amplifier is shared by the first and the second bitcell arrays. Additionally, the sense amplifier is configured to amplify data stored in the memory during a read operation. The memory apparatus also includes a write circuit. The write circuit is configured to write data to the memory during a write operation. The memory apparatus also includes a controller. The controller is configured to disable the write circuit during the read operation.

22 Claims, 7 Drawing Sheets

(51) Int. Cl.
  *G11C 7/10*    (2006.01)
  *G11C 11/418*  (2006.01)
  *G11C 11/419*  (2006.01)
  *G11C 7/02*    (2006.01)
  *G11C 7/12*    (2006.01)

(52) U.S. Cl.
  CPC .......... *G11C 11/418* (2013.01); *G11C 11/419* (2013.01); *G11C 2207/2209* (2013.01); *G11C 2207/2245* (2013.01)

(56) References Cited

U.S. PATENT DOCUMENTS

| | | |
|---|---|---|
| 7,724,586 B2 | 5/2010 | Adams et al. |
| 9,001,569 B1 | 4/2015 | Jain et al. |
| 9,208,900 B2 | 12/2015 | Sinangil et al. |
| 9,256,266 B1 | 2/2016 | Yu et al. |
| 2003/0218900 A1 | 11/2003 | Bando et al. |
| 2011/0255361 A1* | 10/2011 | Russell ................ G11C 7/1075 365/230.05 |
| 2015/0348594 A1* | 12/2015 | Patel ........................ G11C 5/02 365/49.1 |
| 2016/0180948 A1* | 6/2016 | Tanabe ............... G11C 16/0475 365/185.21 |
| 2017/0076773 A1* | 3/2017 | Noguchi ............. G11C 11/1673 |

OTHER PUBLICATIONS

Partial International Search Report—PCT/US2017/053284—ISA/EPO—dated Dec. 5, 2017.

\* cited by examiner

NOISE IMMUNE DATA PATH SCHEME FOR MULTI-BANK MEMORY ARCHITECTURE

CROSS-REFERENCE TO RELATED APPLICATION(S)

This application claims the benefit of U.S. Provisional Application Ser. No. 62/410,704, entitled "A NOISE IMMUNE DATA PATH SCHEME FOR MULTI-BANK MEMORY ARCHITECTURE" and filed on Oct. 20, 2016, which is expressly incorporated by reference herein in its entirety.

BACKGROUND

Field

The present disclosure relates generally to memory circuitry, and more particularly, to a memory with a shared sense amplifier.

Background

Static random-access memory (SRAM) is a type of semiconductor memory. SRAM may use a series of transistors to form cross-coupled inverters. The cross-coupled inverters may form bistable latching circuitry or flip-flop circuitry to store each bit.

An SRAM or other semiconductor memory device may use a sense amplifier. The sense amplifier may be part of the read circuitry that is used when data is read from a memory. The sense amplifier may be configured to sense a low power signal from a bitline in the memory. The low power signal may represent a data bit, e.g., a logic "1" or a logic "0," that is stored in a memory cell of the memory. The sense amplifier may be configured to amplify a small voltage swing to identify logic levels stored in the memory. Amplifying the small voltage swing using the sense amplifier may allow the data to be processed by digital logic that may be coupled to the memory.

Some SRAM devices may have a multi-bank SRAM architecture. A multi-bank SRAM architecture may include two or more banks of SRAM. In some examples, the multi-bank SRAM architecture may use a single shared sense amplifier, e.g., a common sense amplifier.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, an apparatus is provided. The apparatus may be a memory apparatus. The memory apparatus includes a memory. The memory includes a first bitcell array and a second bitcell array. The memory apparatus also includes a sense amplifier. The sense amplifier is shared by the first bitcell array and the second bitcell array. Additionally, the sense amplifier is configured to amplify data stored in the memory during a read operation. The memory apparatus also includes a write circuit. The write circuit is configured to write data to the memory during a write operation. The memory apparatus also includes a controller. The controller is configured to disable the write circuit during the read operation.

In an aspect of the disclosure, an apparatus is provided. The apparatus may be a memory apparatus. The memory apparatus includes a means for storing data. The means for storing data includes a first bitcell array and a second bitcell array. The memory apparatus also includes a means for amplifying. The means for amplifying is shared by the first bitcell array and the second bitcell array and is configured to amplify data stored in the means for storing data during a read operation. Additionally, the memory apparatus includes a means to write data to the means for storing data during a write operation. The memory apparatus also includes a means to disable the means to write data during the read operation.

In an aspect of the disclosure, an apparatus is provided. The apparatus may be a processing system. The processing system includes a processor. The processing system includes a memory coupled to the processor. The memory includes a first bitcell array and a second bitcell array. The processing system also includes a sense amplifier. The sense amplifier is shared by the first bitcell array and the second bitcell array and is configured to amplify data stored in the memory during a read operation. Additionally, the processing system includes a write circuit. The write circuit is configured to write data to the memory during a write operation. Additionally, the processing system includes a controller configured to disable the write circuit during the read operation.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

FIG. 3 is a schematic diagram of an exemplary embodiment of a memory cell for

DETAILED DESCRIPTION

Figure 1:
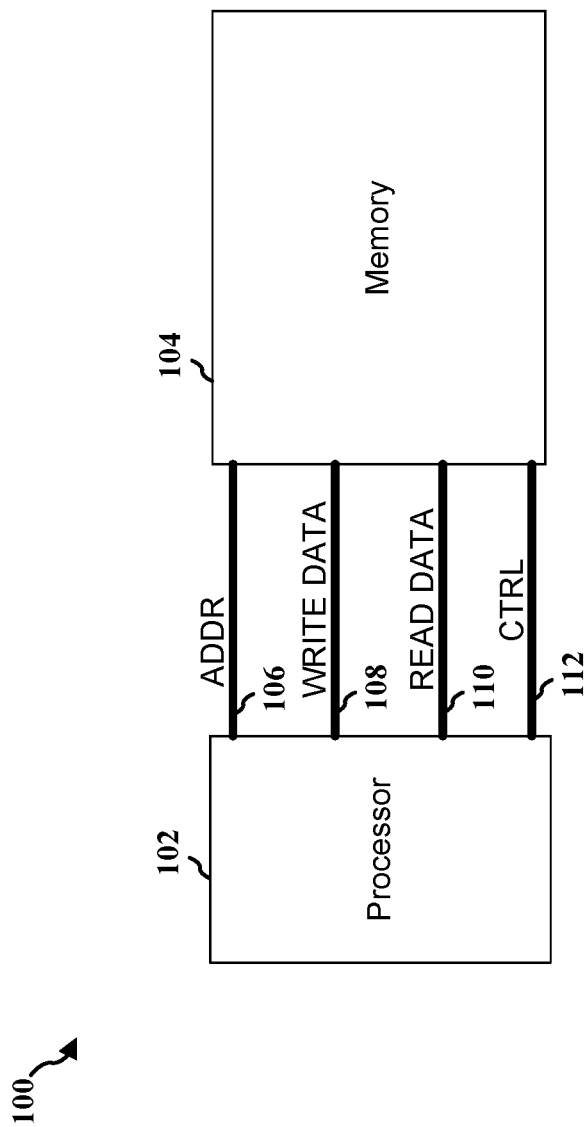
FIG. 1 is a conceptual block diagram illustrating an example of a processing system.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, as will be apparent to those skilled in the art the concepts may be practiced without the specific details. In some instances, well-known structures and components are shown in block diagram form in order to avoid obscuring such concepts. Acronyms and other descriptive terminology may be used for convenience and clarity and are not intended to limit any concept disclosed herein.

Various aspects presented throughout this disclosure may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus does not require that all embodiments of the apparatus include the described components, structure, features, functionality, processes, advantages, benefits, or modes of operation.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of the elements. Rather, such designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Memories may include random access memory (RAM), static random access memory (SRAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable memory. Accordingly, all references to an SRAM are intended only to illustrate exemplary aspects of memory with the understanding that such aspects may be extended to a wide range of applications.

FIG. 1 is a conceptual block diagram illustrating an example of a processing system 100. The processing system 100 includes a processor 102 and a memory 104. The processor 102 may be a microprocessor, microcontroller, digital signal processor (DSP), programmable logic implementing a processor, or other processing circuitry. The memory 104 may be a multibank memory, such as a synchronous dynamic random access memory (SDRAM), or any other multibank component capable of retrieving and storing information.

The processor 102 illustrated in FIG. 1 is connected to the memory 104. The connections between the processor 102 and the memory 104 may include an address bus 106, a write data bus 108, a read data bus 110, and a control bus 112. The write data bus 108 may be used to write data from the processor 102 to the memory 104. The control bus 112 may include signals used to control the writing of data from the processor 102 to the memory 104. The read data bus 110 may be used to read data from the memory 104 to the processor 102. The control bus 112 may include signals used to control the reading of data from the memory 104 to the processor 102. For example, the control bus 112 may include signals such as a read signal and a write signal. The read signal may be a single signal line, e.g., a single bit, that indicates when the memory is being read by the processor 102. The write signal may be a single signal line that indicates when the memory is being written by the processor 102. In some examples, the control bus 112 may also include a byte enable signal. The byte enable signal may be a group of signal lines that indicate the size of the data, e.g., 8, 16, 32, 64 bytes. In some examples, however, the size of the data may be fixed, e.g., one of 8, 16, 32, 64 bytes. Accordingly, the byte enable signal may be optional on the control bus 112.

Other optional signals that may be part of the control bus 112 may include, but are not limited to, a transfer acknowledgment (ACK) signal, a bus request signal, a bus grant signal, an interrupt request signal, one or more clock signals, and a reset signal. The transfer acknowledgment signal may indicate that data is acknowledged by a device, e.g., the processor 102, as having been read. The bus request signal may indicate that a device, e.g., the processor 102 or the memory 104 is requesting the bus, e.g., the processor 102 or the memory 104 is requesting use of the address bus 106 and one of the write data bus 108 or the read data bus 110. The bus grant signal may indicate that the processor 102 has granted access to the bus. The interrupt request signal may indicate to the processor 102 that a lower priority device is requesting the bus. Any clock signals on the control bus 112 may be used to synchronize devices on the control bus 112 such as the processor 102, the memory 104, or both. The reset signal may be used to reset the processor 102, the memory 104, or both. The signals described above as optional may not be used in the example systems described herein, but may be used in particular implementations of the systems and methods described.

The control bus 112 may include a read signal and a write signal. The read signal and the write signal may be used to generate a read enable and a write enable, respectively, within the memory 104 as will be discussed in greater detail with respect to FIG. 3.

The address bus 106 may be used to indicate which location within the memory 104 the processor is reading or writing. For example, if the processor 102 wishes to read a memory location in the memory 104 the processor 102 may output the address of the memory location on the address bus 106. Additionally, the processor 102 may drive the read signal, which may be part of the control bus 112, active. The memory 104 may then output the data in the memory location indicated by the address bus 106 on the read data bus 110. Similarly, if the processor 102 wishes to write a memory location in the memory 104, the processor may output the address of the memory location to be written on the address bus 106. Additionally, the processor 102 may drive the write signal, which may be part of the control bus 112, active. The processor 102 may drive the write data bus 108 with the data that is to be written to the memory 104. In an aspect, the data buses (write data bus 108 and read data bus 110) may be driven to correct logic states before the read or write line is driven active.

The write data bus 108 and the read data bus 110 are illustrated as separate buses in FIG. 1. In other examples, a single bidirectional data bus may be used to write data from the processor 102 to the memory 104 and to read data from the memory 104 to the processor 102. Systems using a single bidirectional data bus may be used to write data from the processor 102 to the memory 104 and to read data from the memory 104 to the processor 102 may include various control signals to allow for the use of a single bidirectional data bus, such as a read/write signal and a data valid signal. The read/write signal may indicate when data is being read or written. The data valid signal may indicate if data on the bidirectional data bus is valid data.

Figure 2:
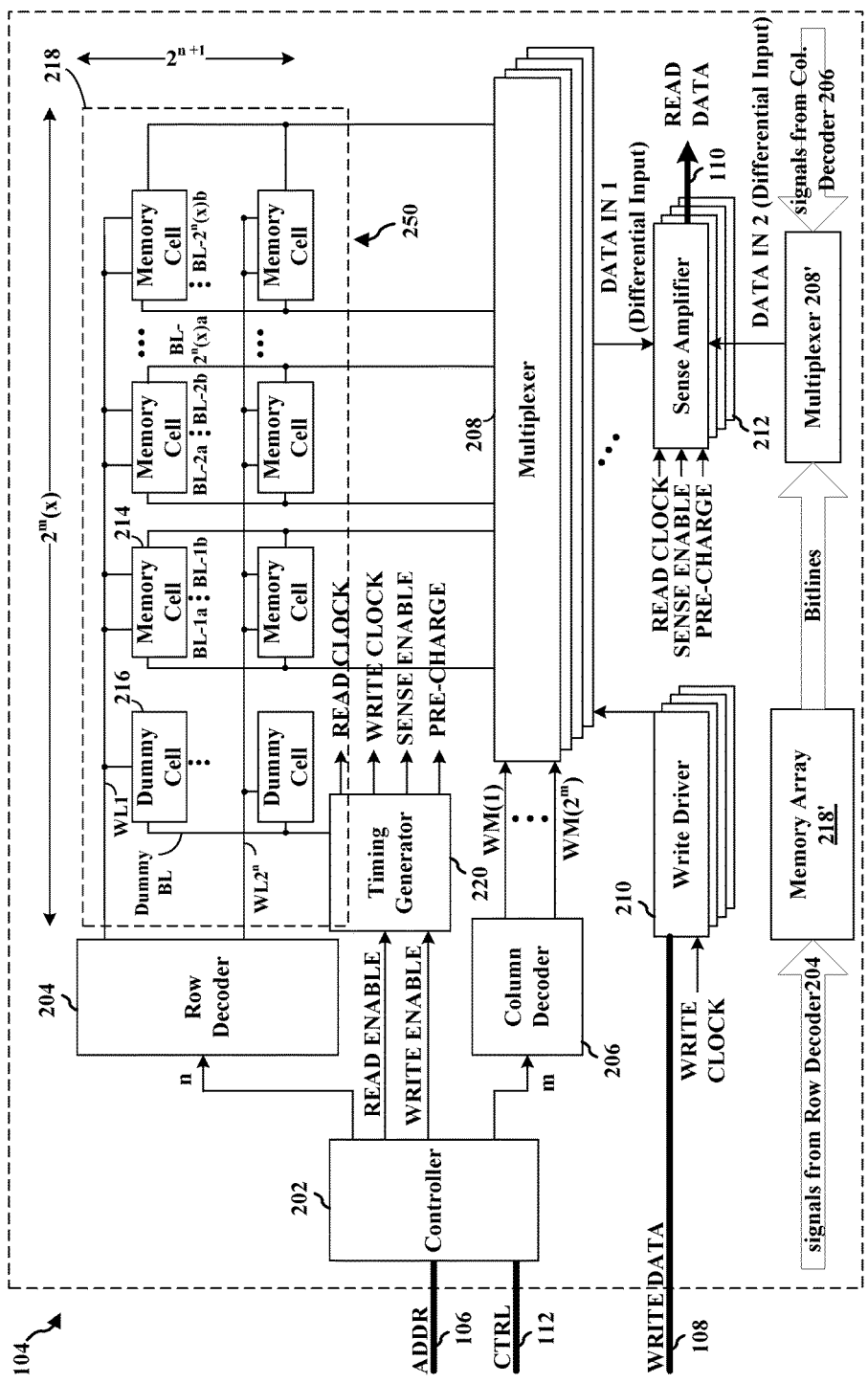
FIG. 2 is a functional block diagram of an exemplary embodiment of an SRAM.

FIG. 2 is a functional block diagram of an exemplary embodiment of a memory 104. The memory 104 may be a static random-access memory (SRAM). The memory 104 may include a memory array 218 with supporting circuitry to decode addresses and perform read and write operations. The memory array 218 may include memory cells 214 for storing data. For example, the memory cell 214 may be a bit cell storing a bit of data. Accordingly, a memory cell such as memory cell 214 in memory 104 may provide a means for storing a first bit. Similarly, another memory cell may provide a means for storing a second bit.

The memory cells 214 may be arranged in columns 250 and may be arranged to share connections in horizontal rows and vertical columns. Specifically, each horizontal row of memory cells 214 may share a wordline WL, and each vertical column of memory cells 214 may share a pair of bitlines (e.g., BL-1$a$ and BL-1$b$). The size of the memory array 218 (e.g., the number of cells) may vary depending on a variety of factors including the specific application, the speed requirements, die layout constraints and testing requirements, and the overall design constraints imposed on the system. The memory array 218 may contain thousands or millions of memory cells.

In the exemplary embodiment of the memory 104 shown in FIG. 2, the memory array 218 may include ($2^n \cdot 2^m(x)$) memory cells 214 arranged in $2^n$ horizontal rows and $2^m(x)$ vertical columns, where $2^m$ is the number of words per row and x is the number of bits per word. A peripheral device (not shown) may randomly access any word (e.g., x cells) in the memory array 218 using an (n+m) bit wide address that is provided through a controller 202 to a row decoder 204 and column decoder 206, respectively. As will be described in greater detail later, the controller 202 may be responsible for the memory read and write operations. For example, the controller may provide the timing for the read and write operations in memory cycles. The output from the controller 202 may include an n-bit address provided to the input of a row decoder 204, and an m-bit address provided to the input of a column decoder 206. The column decoder 206 provides $2^m$ outputs (WM(1)-WM($2^m$)) with a different one of the outputs asserted for each different combination of address inputs.

The outputs may be provided to x multiplexers 208. For a write memory access, each multiplexer may be a $2^m$:1 multiplexer which switches one of x inputs from a write driver 210 between $2^m$ bitline pairs based on the outputs from the column decoder 206. By way of example, a memory array that stores four (4) 128-bit words per row requires 128 4:1 multiplexers. Each multiplexer input is coupled to, for example, one of 128 outputs from the write driver 210. Based on the decoded m-bit address, each multiplexer input may be coupled from the write driver 210 to one of 4 bitline pairs. The 4 bitline pairs may be coupled to four memory cells, each storing a corresponding bit for a different word in a row. For example, the first of the 4 memory cells may store the least significant bit (LSB) of the first word, the second of the 4 memory cells may store the LSB of the second word, the third of the 4 memory cells may store the LSB of the third word, and the fourth of the 4 memory cells may store the LSB of the fourth word.

Thus, when the WRITE ENABLE signal from the controller 202 is asserted, the write driver 210 outputs the Write Data received from the peripheral device (not shown) to x pairs of bitlines BL-a and BL-b with each of the x multiplexers driving one pair of bitlines (e.g., BL-1$a$ and BL-1$b$). The row decoder 204 converts the n-bit address into $2^n$ wordline outputs. A different wordline WL is asserted by the row decoder 204 for each different n-bit row address. As a result, each of the $2^m(x)$ memory cells 214 in the horizontal row with the asserted wordline WL is connected to one pair of the $2^m(x)$ bitlines (e.g., BL-1$a$ and BL-1$b$) through each memory cells 214 access transistors, as will be described in more detail below with reference to FIG. 3. The write data may be driven, through the x multiplexers 208, onto the selected pairs of bitlines (e.g., BL-1$a$ and BL-1$b$) and written to the memory cells with the asserted wordline WL.

For a read memory access, the row decoder 204 converts the n-bit address into one of the $2^n$ read wordlines. A different read wordline WL is selected by the row decoder 204 for each different n-bit row address. As a result, each of the $2^m(x)$ memory cells in the horizontal row with the selected read wordline WL is connected to one of the $2^m(x)$ read bitlines BL through the memory cell's access transistor, as will be described in more detail below with reference to FIG. 3. The $2^m(x)$ read bitlines BL may be used to transmit the bits stored by the $2^m(x)$ memory cells to the x multiplexers 208, with each multiplexer 208 selecting one bit from the $2^m$ bits transmitted on the read bitlines BL to the input of that multiplexer 208. The selected bits from the x multiplexers 208 are provided to the sense amplifier 212 for outputting the read data signal, e.g., on the read data bus 110. Accordingly, a sense amplifier, such as the sense amplifier 212 in memory 104 may provide a means for generating a first data bit output as a function of the first bit when a first read enable is active. Another sense amplifier may provide a means for generating a second data bit output as a function of the first bit when a first read enable is active. After the READ ENABLE signal generated by the controller 202 is asserted, the selected bits are ready for the sense amplifier 212. The READ ENABLE from the controller 202 may be used to generate the READ CLOCK. Additionally, the controller 202 may generate the n and m signals for the row and column decoders, respectively. Data from the multiplexer 208 into the sense amplifier 212 (DATA IN) may be available after the bitline BL and the wordline WL are selected, e.g., based on the n and m signals, and after the READ CLOCK is generated. Generally, there may be a delay from when the bitline BL, the wordline WL, and the READ CLOCK are selected to when data is available. For example, there may be propagation delay through the multiplexer 208 (to DATA IN 1 or DATA IN 2) and propagation delay through the sense amplifier 212 (to READ DATA).

As mentioned earlier, the controller 202 is responsible for memory operations by providing the timing for the read and write operations in a memory cycle. The memory cycle may be defined by the SYSTEM CLOCK input to the controller 202. The timing of the read and write operation is derived from internal READ and WRITE CLOCKS that are used to respectively multiplex READ and WRITE ADDRESS inputs from a peripheral device to the address decoder (i.e., row decoders 204 and column decoders 206). The READ clock may be set by the READ ENABLE and reset by the READ CLOCK RESET. Similarly, the WRITE CLOCK may be set by the WRITE ENABLE once the read operation is complete and reset by the WRITE CLOCK RESET. The READ and WRITE ENABLES may be input to the controller 202 from a peripheral device and controlled by the peripheral device. The READ CLOCK and WRITE CLOCK RESET may be generated by a tracking circuit in the memory array 218 and input to the controller 202. The READ ENABLE may be used to generate the READ CLOCK. The WRITE ENABLE may be used to generate the WRITE CLOCK. The READ CLOCK may be generated by the timing generator 220. The timing generator 220 may be configured to control the timing of the READ CLOCK so that the sense amplifier 212 is active when the DATA IN signal(s) are valid. Similarly, the timing generator 220 may be configured to control the timing of the WRITE CLOCK so that the Write Driver 210 is active when the DWRITE DATA signal(s) are valid.

As used herein, the terms "set" and "reset" with respect to a clock signal or other signal may describe two different logic states of such clock signal or other signal regardless of polarity. By way of example, a clock signal or other signal may be described as having a high logic state (e.g., a logic level "1") when set and a low logic state (e.g., logic "0") when reset. Alternatively, the clock signal or other signal may be described as having a low logic state when set and a high logic state when reset, as might be the case with an inverted clock or signal. Accordingly, the terms "set" and "reset" as used herein may have no defined polarity, but rather should be construed broadly to mean different logic states with reference to one another.

In the described exemplary embodiment, the tracking circuit may include a column of dummy cells, e.g., such as the example dummy cell 216, in the memory array. Dummy cells, such as dummy cell 216, may be used to determine when data from a memory cell, such as memory cell 214, is valid. Each dummy cell 216 may be configured to emulate the operation of a row of memory cells 214. Each dummy cell 216 is connected to the same WL for the dummy cell's 216 row of memory cells 214. (Accordingly, there may be a dummy cell for each row so that each row may be monitored based on that row's dummy cell, e.g., dummy cell 216.) The timing generator 220 may be used to monitor the dummy bit line (BL) from the corresponding dummy cell 216 connected to the asserted WL. Specifically, the timing generator 220 may monitor the dummy BL and compare a voltage on the dummy BL to a threshold to track the access time of the selected memory cell 214 during read and/or write operations.

By way of example, during a read operation, the timing generator 220 monitors the dummy BL and may reset the READ CLOCK when a known bit stored in the dummy cell 216 appears on the dummy BL. (For example, the timing generator 220 may monitor the dummy BL to determine when the dummy BL changes from one logic state (e.g., a logic 1 state) to another logic state (e.g., a logic 0 state). The change in logic state may indicate that data on the corresponding memory cell bit lines is valid.) Similarly, during a write operation, the timing generator 220 monitors the dummy BL and resets the WRITE CLOCK when a known bit written to the dummy cell by the write driver 210 appears on the dummy BL. (For example, the timing generator 220 may monitor the dummy BL to determine when the dummy BL changes from one logic state to another logic state. The change in logic state may indicate that data on the corresponding memory cell bit lines is valid.) In at least one exemplary embodiment, the timing generator 220 may also be used to generate a WRITE READY signal. The WRITE READY signal may be used by the controller to satisfy certain internal timing constraints of the write operation following the read operation. Each memory cell 214 may be configured to store one bit of data (e.g., a logic level "1" or a logic level "0").

In an example, the sense amplifier 212 may be shared between two memory arrays 218, 218' using two multiplexers 208, 208'. The memory array 218' may generally be controlled by the same signals from the row decoder 204 that control the memory array 218. In order to simplify the diagram, the second memory array 218' is presented as a block. The second memory array 218' may have the same or similar structure as the memory array 218. In some aspects, a most significant address bit or a control signal (not specifically illustrated) may be used to select between the two memory arrays 218, 218'.

The multiplexer 208' may generally be controlled by the same signals from the column decoder 206 that control the multiplexer 208. In order to simplify the diagram, the second multiplexer 208' is presented as a block. The second multiplexer 208' may have the same or similar structure as the multiplexer 208. In some aspects, a most significant address bit or a control signal (not specifically illustrated) may be used to select between the two multiplexers 208, 208'.

Figure 3:
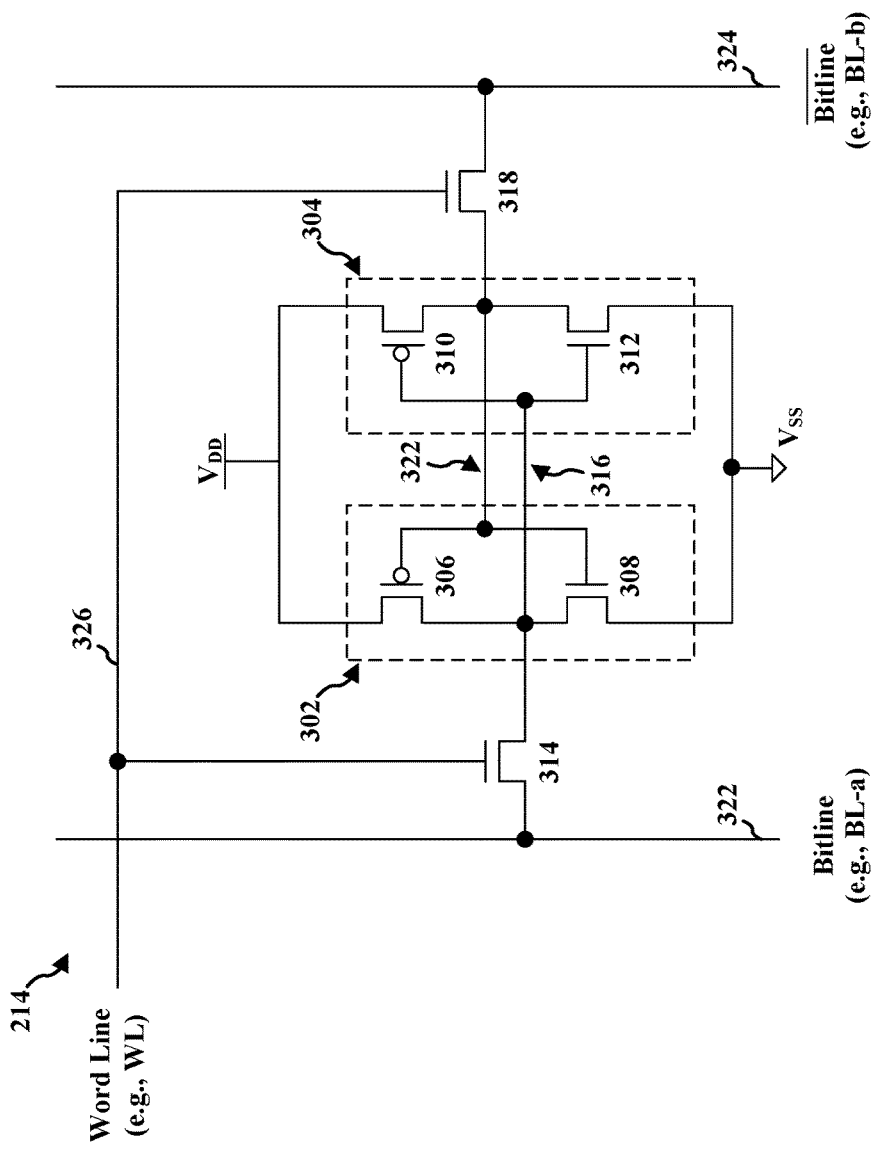

FIG. 3 is a schematic diagram of an exemplary embodiment of the memory cell 214 of FIG. 2 of the memory 104 of FIG. 2. The memory cell 214 illustrated in FIG. 3 is a six-transistor (6T) configuration. However, as those skilled in the art will readily appreciate, the memory cell 214 may be implemented with a four-transistor (4T) configuration, an eight transistor (8T) configuration, a ten transistor (10T) configuration, or any other suitable transistor configuration that may be used to implement a memory cell.

The memory cell 214 is shown with two inverters 302, 304. The first inverter 302 includes a p-channel metal-oxide-semiconductor field effect (PMOS) pull-up transistor 306 and an n-channel metal-oxide-semiconductor field effect (NMOS) 308. The second inverter 304 includes a PMOS pull-up transistor 310 and an NMOS transistor 312. In the described embodiment, the inverters 302 and 304 are powered by VDD and have a return VSS (e.g., ground). The first inverter 302 and the second inverter 304 are interconnected to form a cross-coupled latch. A first NMOS access transistor 314 couples the output node 316 from the second inverter 304 to a bitline BL-a 322, and a second NMOS access transistor 318 couples the output node 322 from the first inverter 302 to a bitline BL-b 324 (the value of which is the opposite or inverse of the bitline 322). The gates of the NMOS access transistors 314, 318 are coupled to a wordline WL 326.

A write operation may be performed by setting the bitlines BL-a 322 and BL-b 324 to active values (with one bitline being opposite the other bitline) and asserting the wordline WL 326. The wordline WL 326 may be asserted before the value to be written (e.g., write data) is provided to the bitlines BL-a 322 and BL-b 324. By way of example, a low value, e.g., a logic level "1" may be written to the memory cell 214 by setting the bitline BL-a 322 to a logic level 0 and the bitline BL-b 324 to a logic level "1." The logic level 0 at the bitline BL-a 322 is applied to the inverter 304 through the NMOS access transistor 314, which in turn forces the output node 322 of the second inverter 304 to VDD. The output node 322 of the second inverter 304 is applied to the input of the first inverter 302, which in turn forces the output node 316 of the first inverter 302 to VSS. A logic level 0 may be written to the memory cell 214 by inverting the values of the bitlines BL-a 322 and BL-b 324. The write driver 210 may be designed to be stronger than PMOS pull-up transistors (306 and 310) in the memory cell 214 so that the write driver 210 can override the previous state of the cross-coupled inverters 302, 304.

Once the write operation is complete, the wordline WL 326 is de-asserted, thereby causing the NMOS access transistors 314 and 318 to disconnect the bitlines BL-a 322 and BL-b 324 from the two inverters 302, 304. The cross-coupling between the two inverters 302, 304 maintains the state of the inverter outputs as long as power is applied to the memory cell 214.

The memory cell 214 stores data according to the data values stored at nodes 316 and 322. If the memory cell 214 stores a logic high (i.e., a '1'), then node 316 is at a logic high and node 322 is at a logic low (i.e., a '0'). If the memory cell 214 stores a logic low, then node 316 is at a logic low and node 322 is at logic high. During a read operation, differential bit lines BL-1a and BL-1b may be pre-charged by a pre-charge circuit. The wordline WL 326 is then asserted, thereby turning on NMOS access transistors 314, 318. The timing between the pre-charging and asserting the wordline WL 326 may be controlled by the row decoder 204.

If memory cell 214 stores a logic high, then bit line BL-1a remains charged via NMOS access transistor 314, and complimentary bit line BL-1b is discharged via NMOS access transistor 318. If memory cell 214 stores a logic low, then bit line BL-1a is discharged via NMOS access transistor 314, and complimentary bit line BL-1b remains charged via NMOS access transistor 318.

One factor in writing a bit-cell relates to the relative sizing, e.g., the current carrying capacity, of the pull-up devices to pass-gate devices. (For example, the ratio of the current carrying capacity of the pull-up devices to the current carrying capacity of pass-gate devices) The relative sizing of the pull-up devices to pass-gate devices may impact a write operation. For examples, when writing a bit-cell, such as memory cell 214, the relative sizing of pull-up devices, e.g., PMOS pull-up transistors 306, 310, relative to pass-gate devices, e.g., NMOS access transistors 314, 318, may impact a write operation. In certain device technologies, the pass-gate devices may be stronger than the pull-up devices. In other words, in certain device technologies, the pass-gate devices, e.g., NMOS access transistors 314, 318, may be capable of providing more current than the pull-up devices, e.g., PMOS pull-up transistors 306, 310.

With the advent of certain device technologies, the dynamics between pass-gate devices, e.g., NMOS access transistors 314, 318, and pull-up devices, e.g., PMOS pull-up transistors 306, 310, has changed. For example, the low voltage operation, read stability, quantized sizes (fin based) and denser core-cell in 14 nm and lower FinFET technology may change the dynamics between pass-gate devices, NMOS access transistors 314, 318, and pull-up devices, e.g., PMOS pull-up transistors 306, 310. In other words, while previous technologies may have pass-gate devices, e.g., NMOS access transistors 314, 318, that are capable of providing more current than the pull-up devices, in FinFET technology, the sizes of the pull-up device and the pass-gate device may be equal. Accordingly, the pass-gate devices may be capable of providing approximately the same current as the pull-up devices, e.g., PMOS pull-up transistors 306, 310, in the FinFET technologies. Having the pass-gate devices provide approximately the same current as the pull-up devices, e.g., PMOS pull-up transistors 306, 310, may impact performance of a write operation. Accordingly, a successful write operation may be a concern in FinFET technology.

Write assist techniques to help ensure a successful write operation include Negative Bitline Level (NBL) and other techniques to assist writing to a memory, such as an SRAM memory. NBL may be used to assist a write operation into an SRAM bitcell such as memory cell 214. NBL is a write assist technique for SRAM arrays. With NBL, the write features of the memory cell 214 may increase the probability of a successful write operation by applying a negative voltage to one of the bitlines, e.g., BL-a, BL-b, in the memory cell 214 while another bitline, e.g., BL-b, BL-a, is connected to a boosted voltage. The probability of a successful write operations may be increased because of, for example, the boosting scheme from both sides of the memory cell 214. NBL may be applied to various types of SRAM cells, such as 6T-SRAM cells, 8T-SRAM cells, 9T-SRAM cells, and a 10T-SRAM cells. (FIG. 3 illustrates a memory cell 214 that is a 6T-SRAM cell. However, the systems and methods described herein may be applied to other types of SRAM memory cells.) NPL may provide faster write time and/or increased write margins compared to other SRAM cells without NBL.

Figure 4:
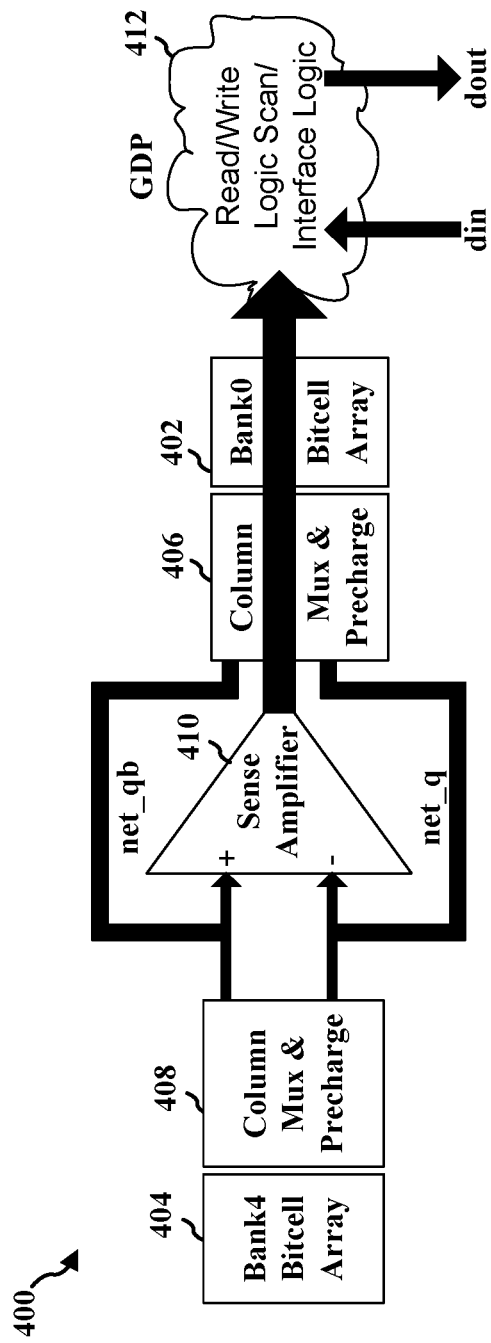
FIG. 4 illustrates an SRAM having a multi-bank SRAM architecture.

FIG. 4 illustrates an SRAM 400 having a multi-bank SRAM architecture. The SRAM 400 includes a bitcell array (bank 0 bitcell array) 402 and a bitcell array (bank 1 bitcell array) 404. The SRAM 400 also includes a column multiplexer and precharge circuit 406 associated with the bitcell array (bank 0 bitcell array) 402 and a column multiplexer and precharge circuit 408 associated with the bitcell array (bank 1 bitcell array) 404. As illustrated in FIG. 4, the SRAM architecture uses a shared sense amplifier 410. The sense amplifier 410 is coupled to the column multiplexer and precharge circuit 406 and the column multiplexer and precharge circuit 408. For example, the net_q and net_qb signals from the column multiplexer and precharge circuit 406 and the column multiplexer and precharge circuit 408 are coupled to the negative and positive inputs respectively of the sense amplifier 410. The output of the sense amplifier 410 may be an input to read/write logic and scan interface logic 412. The read/write logic and scan interface logic 412 may have as an input the data in signal (din) and as an output, the data out signal (dout).

Figure 5:
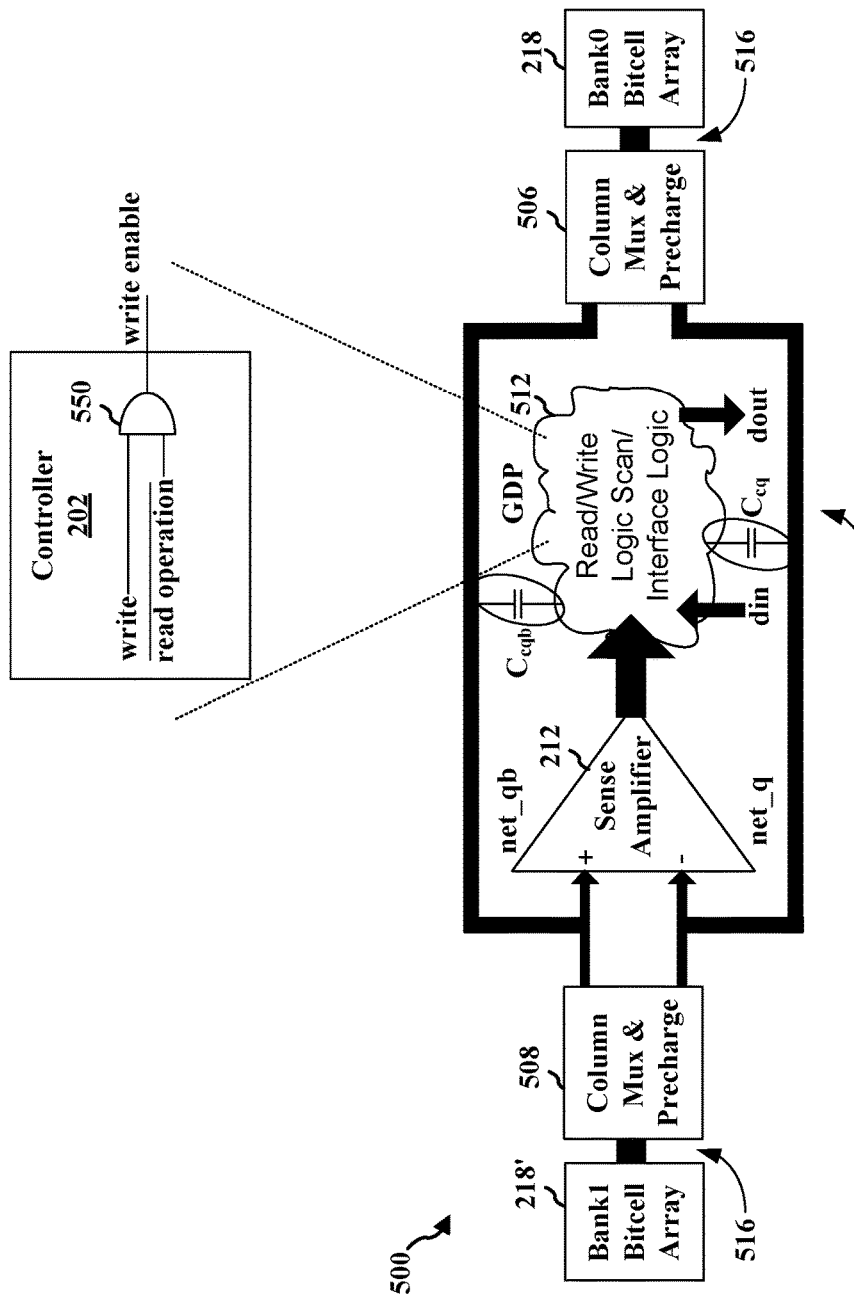
FIG. 5 illustrates another SRAM having a multi-bank SRAM architecture.

FIG. 5 illustrates another SRAM 500 having a multi-bank SRAM architecture. The SRAM 500 includes a bitcell array (bank 0 bitcell array) 218 and a bitcell array (bank 1 bitcell array) 218'. The SRAM 500 also includes a column multiplexer and precharge circuit 506 associated with the bitcell array (bank 0 bitcell array) 218 and a column multiplexer and precharge circuit 508 associated with the bitcell array (bank 1 bitcell array) 218'. The column multiplexer and precharge circuit 508 may be used to read the bitcell array 218. The column multiplexer and precharge circuit 506 may be used to read the bitcell array 218'.

As illustrated in FIG. 5, the SRAM architecture uses a shared sense amplifier 212. The sense amplifier 212 is coupled to the column multiplexer and precharge circuit 506 and the column multiplexer and precharge circuit 508. For example, the net_q and net_qb signals from the column multiplexer and precharge circuit 506 and the column multiplexer and precharge circuit 508 are coupled to the negative and positive inputs respectively of the sense amplifier 212. The output of the sense amplifier 212 may be input to read/write logic and scan interface logic 512. The read/write logic and scan interface logic 512 may have as an input the data in signal (din) and as an output, the data out signal (dout).

The SRAM 500 is illustrated as having a capacitive coupling, e.g., capacitor Ccqb and capacitor Ccq, between the read/write logic and scan interface logic 512 and the net_qb and net_q signals respectively.

The multi-bank SRAM architecture illustrated in FIG. 5 may be more area efficient than the multi-bank SRAM architecture illustrated in FIG. 4. For example, because a global data path may be in-between the two local data paths in the multi-bank SRAM architecture illustrated in FIG. 5, the size of the buffers and additional control logic may be smaller when compared to the buffers and additional control logic in the multi-bank SRAM architecture illustrated in FIG. 5. More specifically, the multi-bank SRAM architecture illustrated in FIG. 5 may be more area efficient than the multi-bank SRAM architecture illustrated in FIG. 4 with respect to the area of the bitcell array 218, the bitcell array 218', the column multiplexer and precharge circuit 506, and the column multiplexer, precharge circuit 508, the sense amplifier 212, and 512 the read/write logic and scan interface logic 512.

As illustrated in FIG. 5, the multi-bank SRAM architecture of FIG. 5 also uses a single sense amplifier 212 shared by the two bitcell arrays 218 and 218'.

Additionally, the multi-bank SRAM architecture illustrated in FIG. 5 may be considered a global data path (GDP) architecture 514. The GDP architecture 514 may include data input/output latches, read/write logic, and other data path functionality.

The multi-bank SRAM architecture illustrated in FIG. 5 also include a local data path (LDP) 516. The LDP 516 may be placed at either end of the SRAM 500 interfacing with the bit cell arrays 218, 218'. The LDP 516 includes read/write column multiplexers, bit line precharge circuitry, and other local data path functionality 506, 508.

As discussed above, in FIG. 5, the sense amplifier 212 is shared by the two local data paths. Accordingly, the sense amplifier 212 match nodes (net_q/net_qb), across which the differential outputs of the precharge circuits 506, 508 may be evaluated by the sense amplifier 212, may be routed from one LDP 516 to the other LDP 516. In other words, both LDPs 516 are connected to the sense amplifier 212 match nodes. In the example of FIG. 5, the sense amplifier 212 match nodes (net_q/net_qb) may be particularly susceptible to coupling noise. The multi-bank SRAM architecture of FIG. 5 may be more susceptible to coupling noise than the multi-bank SRAM architecture of FIG. 4 because the connections between the LDPs 516 and the match nodes (net_q/net_qb) are routed across the GDP architecture 514 logic in the example of FIG. 5.

Dedicated shielding routes for the net_q/net_qb nodes may not be available because of limited availability of Metal 2 tracks (especially for 14 nm and smaller feature size processes). Dedicated shielding routes using Metal 4 (and higher) layers may not be used due to a risk of unknown noise coupling from signals running in higher metal layers. Coupling capacitance from other metal layers, e.g., M3 to M2 and M1 to M2, may have significantly higher capacitance values. Coupling capacitance from M3 to M2 and M1 to M2 for less advanced technology nodes such as 28 nm and 20 nm processes do not generally have significant capacitance. In lower technology nodes such as 10 nm, however, M3 to M2 and M1 to M2 may have higher capacitance and may cause significant interference due to higher coupling between metal stack layers. Accordingly, more noise may be injected to the net_q/net_qb sense amplifier nodes in lower technology nodes. Because the capacitance values of other metal layers may be significantly higher compared to the lower metal layers, the other metal layers may inject more noise onto the signal lines to the sense amplifier (e.g., net_q, net_qb).

The signals that may be present on the write path may inject ~20 my of noise to the sense amplifier 212 match nodes (net_q/net_qb). The sense amplifier 212 evaluation time may have to increase to recover the differential loss due to the change in architecture of the memory, e.g., logic location relative to net_q/net_qb, for qualifying a 6.5σ sized bitcell. The increased evaluation time may degrades the performance of the multi-bank SRAM with respect to the performance of other architectures, e.g., FIG. 4. The degraded performance may not be acceptable in SRAM operation.

In one example, the difference between the voltages of the bitline and the complimentary bitline (DVBL) after charge sharing is performed needs to be greater than: (3.3*sense amplifier offset for a yield) volts to accurately amplify the voltage difference. In one example, approximately:

3.3*6 mv=20mv.

The sense amplifier 212 evaluation time may have to increase by about 1.7×, e.g., relative to the sense amplifier 410 to recover the differential loss due to the longer net_q/net_qb for a qualifying 6.5σ bitcell. To maintain yield of the design illustrated in FIG. 5 relative to the yield of the design illustrated in FIG. 4, the performance, e.g., access time of the memory of FIG. 5 relative to the access time of the memory of FIG. 4 may have to be degraded by up to 30%, i.e., >250 ps loss in access time in the current example.

Referring to the sense amplifier 212, the signals on the read path do not affect the sense amplifier 212 match nodes (net_q/net_qb), i.e., the sense amplifier 212 differential voltage inputs, however. The signals on the read path do not affect the sense amplifier 212 match nodes (net_q/net_qb), because the signals on the read path toggle after the sense amplifier 212 is enabled. On the other hand, the write path signals may affect the sense amplifier 212 match nodes (q/qb) because the signals on the write path may toggle at the sense amplifier 212 is enabled. However, if the write logic signals are stable during read operations, the sense amplifier 212 nodes will not be disturbed. Bclk2/bclk3 may be enabled during write/scan and may be disabled at other times. The impact of signals (e.g., write signals) on the read path may be minimized by disabling the write circuit during the read operation, e.g., to disable the progression of write data during a read operation.

The multi-bank SRAM architecture illustrated in FIG. 5 may be modified to disable a write circuit during at least a portion of a read operation (or read mode), such as during an amplification of read data. A disabled write circuit will not generate signals that may affect the sense amplifier 212 match nodes (net_q/net_qb).

In an aspect the write circuitry (trigger bclk) may be disabled during read mode to disable the write path logic until sense evaluation is done. Disabling the write circuitry may keep noise from the write circuitry from impacting a read performed during the read mode. For example, the progression of write data may be disabled during the read operation. Disabling the progression of write data during a read operation may decrease or eliminate noise that would be generated by changes on signal lines that may occur when signal lines change as data signals progress through a circuit.

In another aspect, the propagation delay of the write logic may be accounted for in a setup time calculation for the setup time of the sense amplifier 212 match nodes (net_q/ net_qb) during read mode. The setup time calculation may ensure that the write logic is settled and valid before the sense amplifier 212 precharge signal and bit line precharge signal become inactive.

In another aspect, the write path may be used as a shielding mechanism for the sensitive read nodes because the metal tracks may be too scarce and thus may not be available to use a dedicated shielding mechanism. For example, signal traces for the write path may run parallel to signal traces for the read path such that the write path may be used as a shielding mechanism for the sensitive read nodes. Accordingly, the write path signals may be used for shielding in place of other scarce resources such as routing resources for a dedicated shielding mechanism. Thus, the write path may provide shielding when not being used to perform a write operation.

One example of a memory apparatus is the SRAM 500. The SRAM 500 includes a memory, e.g., a series of SRAM cells in the SRAM 500, including first and second bitcell arrays 218, 218'. The SRAM 500 also includes a sense amplifier 212. The sense amplifier 212 is shared by the first and the second bitcell arrays 218, 218' and is configured to amplify data stored in the memory during a read operation. A write circuit, e.g., in the read/write logic and scan interface logic 512, is configured to write data to the memory, e.g., the series of SRAM cells in the SRAM 500, during a write operation.

The series of SRAM cells in the SRAM 500 are split into the two banks, e.g., the first and the second bitcell arrays 218, 218'. Additionally, the SRAM 500 also includes a controller, e.g., part of the read/write logic and scan interface logic 512, that is configured to disable the write circuit during the read operation, e.g., to disable the progression of write data during a read operation.

The read/write logic and scan interface logic 512 may include, in part, the controller 202. The controller 202 may include a logic gate, e.g., AND gate 550. The controller 202 may be configured to disable the write circuit, e.g., write enable, during the read operation, e.g., to disable the progression of write data during a read operation. In one aspect, the controller 202 disables the write circuit, e.g., in the read/write logic and scan interface logic 512, by disabling a passgate (e.g., AND gate 550) within the write logic of the read/write logic and scan interface logic 512 during a read mode. For example, a control signal (read operation, active low) may be connected to a logic gate, e.g., an AND gate 550. The AND gate 550 may not allow a write signal to pass to the AND gate 550 output and be propagated from the controller 202 in the read/write logic to the write circuitry when a read occurs. For example, write enable may be blocked.

In one aspect, the passgate (e.g., AND gate 550) within the write logic, e.g., in the read/write logic and scan interface logic 512, is at an input of the write circuit. For example, a logic gate, e.g., an AND gate 550, may be the passgate. The AND gate 550 (or other gate used as a passgate) may be at an input of the write circuit, e.g., may be the write enable signal. An input of the AND gate 550 (read operation, active low) may control when a particular signal (write), which becomes the write enable is allowed to pass or be blocked.

In one aspect, the controller 202, e.g., in the read/write logic and scan interface logic 512, disables the passgate at a start of the write mode. For example, the controller may control the state of a signal that is coupled to a logic gate such as an AND gate 550, which may be used as the passgate. The timing of the read operation (active low) signal may be such that the passgate is disabled at a start of the writemode.

In one aspect, the controller, e.g., in the read/write logic and scan interface logic 512 disables the passgate a predetermined time prior to an amplification of the data stored in the memory, e.g., by the sense amplifier. The predetermined time accounts for the propagation delay of the write circuit. For example, the controller may control the state of a signal that is coupled to a logic gate such as an AND gate, which may be used as the passgate. The controller may take the timing of the control signal into account. For example, the timing of the signal transition from one state to another state may be adjusted such that the output of the AND gate time accounts for the propagation delay of the write circuit.

One aspect includes a write signal path coupled to the write logic. The write signal path is configured to shield a conductor coupled to the sense amplifier. For example, the write signal path may be configured to shield net_qb and/or net_q. In an aspect, the write signal path(s) may run parallel to the shield net_qb and/or net_q. Additionally, the write signal path(s) may be proximal to the shield net_qb and/or net_q. Proximity of the write signal path(s) to shielding may reduce coupling of noise into the write signal path(s), e.g., into sense amplifier 212 inputs.

In one aspect, the sense amplifier 212 input includes a differential input, e.g., such as the differential input illustrated at the sense amplifier 212 of FIG. 5. The differential input includes a first input and a second input and a conductor coupled to a sense amplifier input. The conductor includes a first conductor, e.g., net_qb, and a second conductor, e.g., net_q. The first conductor is coupled to the first input and the second conductor coupled to the second input.

On aspect includes read logic, e.g., in the read/write logic and scan interface logic 512, driven by an output of the sense amplifier 212. As illustrated in FIG. 5, the output of the sense amplifier 212 drives the read/write logic and scan interface logic 512. The output of the sense amplifier 212 may be inactive during the sense evaluation by the sense amplifier 212. For example, once the sense amplifier output is determined, any noise on net_q/net_qb will not impact the read operation. Accordingly, coupling from such sense amplifier output signals may be ignored.

In one aspect, the write circuit, e.g., in the read/write logic and scan interface logic 512, is proximal the sense amplifier 212. For example, as illustrated in FIG. 5, the read/write logic and scan interface logic 512 may be proximal the sense amplifier 212.

An example memory apparatus, e.g., SRAM 500, may include a means for storing data including first and second bitcell arrays 218, 218'. The example memory array may include a means for amplifying, such as the sense amplifier 212. The means for amplifying may be shared by the first and the second bitcell arrays 218', 218 and configured to amplify data stored in the means for storing data, e.g., the first and the second bitcell arrays 218', 218 during a read operation. The example memory array may include a means to write data, e.g., the read/write logic and scan interface logic 512, to the means for storing data, e.g., the first and second bitcell arrays 218, 218', during a write operation. The means to write data may include the address and data busses, which may be controlled by signals used to write data. The example memory array may include a means to disable the means to write data during the read operation, e.g., the read/write logic and scan interface logic 512.

The means to disable the means to write may disable the means to write data by disabling a passgate within the write logic during a write mode. Additionally, the passgate within the write logic may be at an input of the means to write data. The means to disable the means to write may disable the passgate at a start of the write mode. Additionally, the means to disable the means to write may disable the passgate a predetermined time prior to an amplification of the data stored in the means for storing data, e.g., by the sense amplifier. The predetermined time may account for the propagation delay of the means to write data.

In an example, a write signal path coupled to the write logic may be configured to shield a conductor coupled to the means for amplifying. The write signal path is configured to shield a conductor coupled to the sense amplifier. For example, the write signal path may be configured to shield net_qb and/or net_q. In an example, the write signal path(s) may run parallel to the shield net_qb and/or net_q. Additionally, the write signal path(s) may be proximal to the shield net_qb and/or net_q.

In an example, the means for amplifying input includes a differential input stage having a first input and a second input and a conductor coupled to the means for amplifying input. The conductor may include a first conductor and a second conductor. The first conductor may be coupled to the first input and the second conductor coupled to the second input.

An example may include read logic driven by an output of the means for amplifying. The output of the means for amplifying may be inactive during the sense evaluation by the means for amplifying. For example read logic, e.g., in the read/write logic and scan interface logic 512, may be driven by an output of the sense amplifier 212. As illustrated in FIG. 5, the output of the sense amplifier 212 drives the read/write logic and scan interface logic 512. The output of the sense amplifier 212 is inactive during the sense evaluation by the sense amplifier 212. For example, the output of the sense amplifier 212 may be disabled during the sense evaluation by the sense amplifier 212.

In an example, the means to write data is proximal the means for amplifying. For example, the write circuit, e.g., in the read/write logic and scan interface logic 512, is proximal the sense amplifier 212. For example, as illustrated in FIG. 5, the read/write logic and scan interface logic 512 may be proximal the sense amplifier 212.

Figure 6:
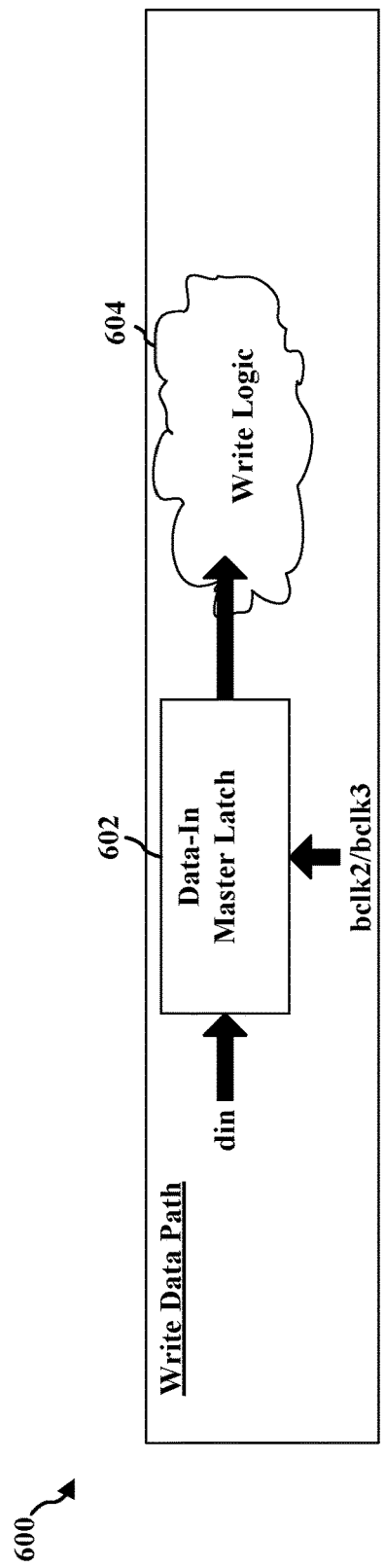
FIG. 6 is a diagram illustrating memory system including a data-in latch and write logic.

FIG. 6 is a diagram illustrating a memory system 600 including a data-in master latch 602 and write logic 604. In an example, the memory system 600 may enable bck2/bclk3 during a write or scan cycle. In the memory system 600 bck2/bclk3 may not be enabled outside of a write or scan cycle. For example, bck2/bclk3 may not be disabled during a read cycle or other times outside of a write or scan cycle.

Memory system 600 may clock data input values, e.g., on din, into the data-in master latch 602 when bck2/bclk3 are active, e.g., during a write or scan cycle. The data on din may be clocked into the data-in latch 602 and may be on the output of the data-in latch 602, e.g., during a write or scan cycle. Accordingly, during a write or scan cycle the write logic 604 may receive data from data in (din) that has been clocked into the data-in latch 602. In some examples, the write logic 604 may not receive data from data in (din) that has been clocked into the data-in latch 602 outside of a write or scan cycle.

Figure 7:
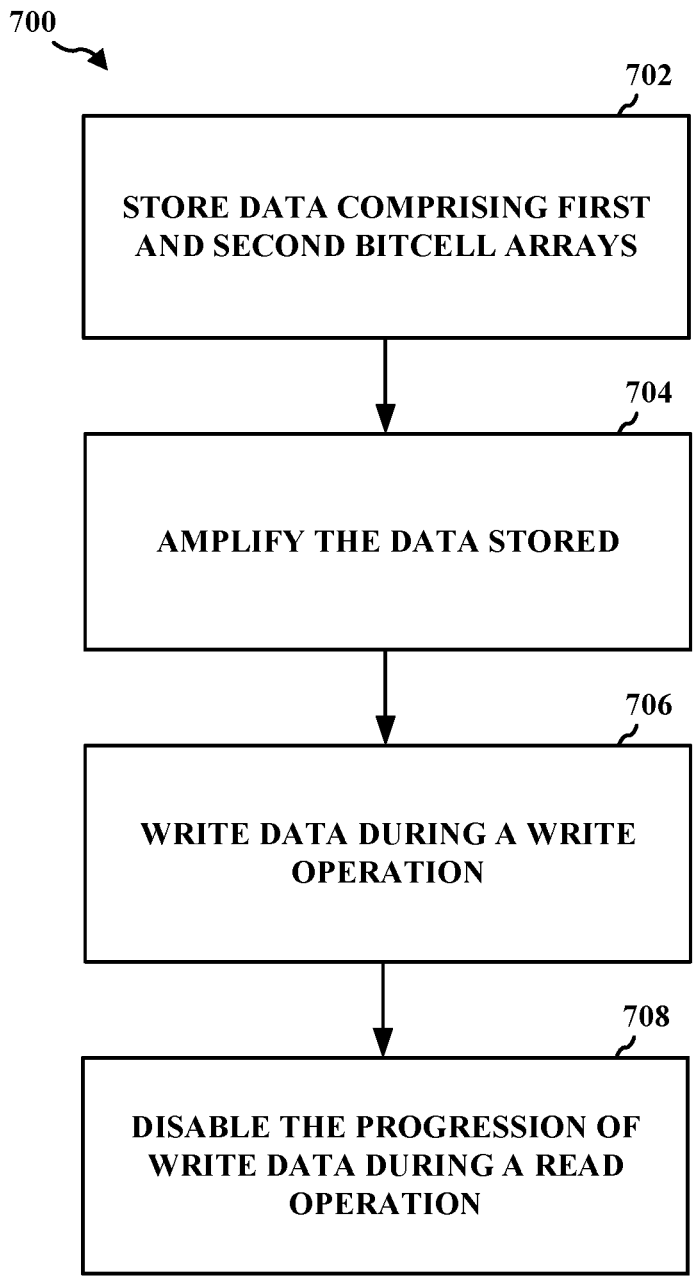
FIG. 7 is a flowchart of a method in a memory.

FIG. 7 is a flowchart 700 of a method for operating a memory. The method may be performed by a memory apparatus, e.g., memory 104, SRAM 500, or memory system 600. At 702, store data in at least one of a first bitcell array and a second bitcell array. For example, the memory apparatus, e.g., memory 104, SRAM 500, or memory system 600 may store data in at least one of a first bitcell array and a second bitcell array. More specifically, in an aspect, the SRAM 500 of FIG. 5 includes a bitcell array (bank 0 bitcell array) 218 and a bitcell array (bank 1 bitcell array) 218'. The bitcell arrays 218, 218' may be written to store data to at least one of the first bitcell array and the second bitcell array. For example, data may be stored in the bitcell array 218 and/or data may be stored in the bitcell array 218'. Data may be written to a memory such as an SRAM that may form the memory 104 by writing data on the write data bus 108 and configuring the control signals on the control bus 112 to perform a write. In memory 104, the memory arrays 218, 218' may each be one of the bitcell arrays 218, 218'.

At 704, the stored data may be amplified. For example, memory apparatus, e.g., memory 104, SRAM 500, or memory system 600 may amplify the data stored, e.g., in the accessed location of the memory. More specifically, a sense amplifier 212, 212, e.g., in SRAM 500 may amplify the data stored in the bitcell array (bank 0 bitcell array) 218, the bitcell array (bank 1 bitcell array) 218', or both. The data stored in the bitcell array (bank 0 bitcell array) 218 may be coupled to the amplifier through the column multiplexer and precharge circuit 506. The bitcell array (bank 1 bitcell array) 218' may be coupled to the amplifier through the column multiplexer and precharge circuit 508 associated. The column multiplexer and precharge circuit 506 and the column multiplexer and precharge circuit 508.

At 706, during a write operation data may be written to the particular location of memory enabled by the address bus. For example, memory apparatus, e.g., memory 104, SRAM 500, or memory system 600 may write data during a write operation. For example, the processor 102 may write to the memory 104 using the address bus 106, write data bus 108, and the control signals on control bus 112.

At 708, during a read operation writing of data is disabled or more specifically, in an example, the progression of write data during a read operation may be disabled. For example, the memory apparatus, e.g., memory 104, SRAM 500, or memory system 600 may disable the writing of data during the read operation, e.g., to disable the progression of write data during a read operation. In an aspect, disabling the writing of data disables a passgate during a read mode. In an aspect, disabling the writing of data disables the passgate at a start of the write mode. In other examples, a write enable may be disabled. Another aspect may have a separate clocked signal to enable the write path only during the write cycle.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." No claim element is to be construed under the provisions of 25 U.S.C. § 112(f) unless the element is expressly recited using the phrase "means for" or, in the case of a method claim, the element is recited using the phrase "step for."

What is claimed is:

1. A memory apparatus, comprising
   a memory comprising a first bitcell array and a second bitcell array;
   a sense amplifier shared by the first bitcell array and the second bitcell array and configured to amplify data stored in the memory during a read operation;
   a write circuit configured to write data to the memory during a write operation; and
   a controller configured to disable the write circuit during only an amplification portion of the read operation.

2. The memory apparatus of claim 1, wherein the controller disables the write circuit by disabling a passgate within a write logic during a read mode.

3. The memory apparatus of claim 2, wherein the passgate within the write logic is at an input of the write circuit.

4. The memory apparatus of claim 2, wherein the controller disables the passgate at a start of a write mode.

5. The memory apparatus of claim 2, wherein the controller disables the passgate a predetermined time prior to an amplification of the data stored in the memory, the predetermined time accounting for a propagation delay of the write circuit.

6. The memory apparatus of claim 1, further comprising a write signal path coupled to a write logic, configured to shield a conductor coupled to the sense amplifier.

7. The memory apparatus of claim 1, the sense amplifier having a sense amplifier input, wherein the sense amplifier input comprises a differential input including a first input and a second input and a conductor coupled to the sense amplifier input, the conductor comprising a first conductor and a second conductor, the first conductor coupled to the first input and the second conductor coupled to the second input.

8. The memory apparatus of claim 1, further comprising read logic driven by an output of the sense amplifier, the output of the sense amplifier inactive during a sense evaluation by the sense amplifier.

9. A memory apparatus, comprising
   means for storing data comprising a first bitcell array and a second bitcell array;
   means for amplifying shared by the first bitcell array and the second bitcell array and configured to amplify data stored in the means for storing data during a read operation;
   means for writing data to the means for storing data during a write operation; and
   means for disabling the means for writing data during only an amplification portion of the read operation.

10. The memory apparatus of claim 9, wherein the means for disabling the means for writing data disables a passgate within the means for writing data during a read mode.

11. The memory apparatus of claim 10, wherein the passgate within the means for writing data is at an input of the means for writing data.

12. The memory apparatus of claim 10, wherein the means for disabling the means for writing data disables the passgate at a start of a write mode.

13. A processing system, comprising
    a processor;
    a memory, coupled to the processor, the memory comprising a first bitcell array and a second bitcell array;
    a sense amplifier shared by the first bitcell array and the second bitcell array and configured to amplify data stored in the memory during a read operation;
    a write circuit configured to write data to the memory during a write operation; and
    a controller configured to disable the write circuit during only an amplification portion of the read operation.

14. The processing system of claim 13, wherein the controller disables the write circuit by disabling a passgate within a write logic during a read mode.

15. The processing system of claim 14, wherein the passgate within the write logic is at an input of the write circuit.

16. The processing system of claim 14, wherein the controller disables the passgate at a start of a write mode.

17. The processing system of claim 14, wherein the controller disables the passgate a predetermined time prior to an amplification of the data stored in the memory, the predetermined time accounting for a propagation delay of the write circuit.

18. The processing system of claim 13, further comprising a write signal path coupled to a write logic, configured to shield a conductor coupled to the sense amplifier.

19. The processing system of claim 13, the sense amplifier having a sense amplifier input, wherein the sense amplifier input comprises a differential input including a first input and a second input and a conductor coupled to the sense amplifier input, the conductor comprising a first conductor and a second conductor, the first conductor coupled to the first input and the second conductor coupled to the second input.

20. A method in a memory, the method comprising:
    storing data in at least one of a first bitcell array and a second bitcell array;
    amplifying the data stored;
    writing the data during a write operation; and
    disabling a progression of write data during only an amplification portion of a read operation.

21. The method of claim 20, wherein disabling the progression of write data disables a passgate during a read mode.

22. The method of claim 21, wherein disabling the progression of write data disables the passgate at a start of a write mode.

* * * * *